US 12,033,690 B2

(12) United States Patent
Su

(10) Patent No.: US 12,033,690 B2
(45) Date of Patent: Jul. 9, 2024

(54) SENSE AMPLIFIER, MEMORY AND CONTROL METHOD

(71) Applicant: CHANGXIN MEMORY TECHNOLOGIES, INC., Hefei (CN)

(72) Inventor: Hsin-Cheng Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 118 days.

(21) Appl. No.: 17/842,161

(22) Filed: Jun. 16, 2022

(65) Prior Publication Data

US 2022/0319579 A1   Oct. 6, 2022

Related U.S. Application Data

(63) Continuation of application No. PCT/CN2021/107681, filed on Jul. 21, 2021.

(30) Foreign Application Priority Data

Mar. 24, 2021 (CN) .......................... 202110314347.3

(51) Int. Cl.
 *G11C 7/12*        (2006.01)
 *G11C 11/4074*  (2006.01)
 (Continued)

(52) U.S. Cl.
 CPC ...... *G11C 11/4091* (2013.01); *G11C 11/4074* (2013.01); *G11C 11/4094* (2013.01); *G11C 11/4096* (2013.01)

(58) Field of Classification Search
 CPC ............ G11C 11/4091; G11C 11/4074; G11C 11/4094; G11C 11/4096
 See application file for complete search history.

(56) References Cited

U.S. PATENT DOCUMENTS 5,526,313 A   6/1996 Etoh
5,659,260 A   8/1997 Kajimoto
(Continued)

FOREIGN PATENT DOCUMENTS

CN   1471107 A   1/2004
CN   1496568 A   5/2004
(Continued)

OTHER PUBLICATIONS

First Office Action of the Chinese application No. 202110314347.3, issued on Feb. 22, 2022, 19 pages.
(Continued)

*Primary Examiner* — Min Huang
(74) *Attorney, Agent, or Firm* — Kilpatrick Townsend & Stockton LLP

(57) ABSTRACT

A sense amplifier (SA), a memory and a control method are provided. The SA includes an amplifying module, configured to amplify voltage difference between a BL and a BLB when the SA is in an amplifying stage; a controllable power module, connected to the amplifying module and configured to stop providing power to the amplifying module when the SA is in a writing stage, to enable the amplifying module to stop working; and a writing module, connected to the BL and the BLB and configured to pull the voltage difference between the BL and the BLB according to data to be written when the SA is in the writing stage. The solution may ensure the successful data writing in a storage unit in a case that a writing circuit has weak drive capability.

17 Claims, 6 Drawing Sheets

(51) Int. Cl.
*G11C 11/4091* (2006.01)
*G11C 11/4094* (2006.01)
*G11C 11/4096* (2006.01)

(56) References Cited

U.S. PATENT DOCUMENTS

| | | | |
|---|---|---|---|
| 5,880,989 A * | 3/1999 | Wilson | G11C 11/22 365/145 |
| 6,147,916 A | 11/2000 | Ogura | |
| 6,819,600 B2 | 11/2004 | Sim | |
| 6,847,568 B2 | 1/2005 | Gogl | |
| 7,394,714 B2 | 7/2008 | Lin | |
| 7,450,455 B2 | 11/2008 | Kang | |
| 7,663,953 B2 | 2/2010 | Cheng | |
| 8,295,101 B2 | 10/2012 | Kajigaya | |
| 8,797,817 B2 | 8/2014 | Joo | |
| 8,873,307 B2 | 10/2014 | Kajigaya | |
| 9,431,071 B2 | 8/2016 | Moon | |
| 9,449,680 B2 | 9/2016 | Huang | |
| 9,627,011 B1 | 4/2017 | Conte et al. | |
| 9,779,802 B1 | 10/2017 | Chang | |
| 10,224,093 B2 | 3/2019 | Kim et al. | |
| 10,381,096 B2 | 8/2019 | Maejima et al. | |
| 10,388,355 B1 | 8/2019 | Ware | |
| 10,726,898 B1 | 7/2020 | Maffitt | |
| 10,867,668 B2 | 12/2020 | Gupta et al. | |
| 11,276,438 B2 | 3/2022 | Wang | |
| 2004/0027892 A1 | 2/2004 | Sim | |
| 2004/0218446 A1 | 11/2004 | Gogl | |
| 2007/0076501 A1 | 4/2007 | Kang | |
| 2007/0109878 A1 | 5/2007 | Gouin | |
| 2007/0183234 A1 | 8/2007 | Han et al. | |
| 2008/0062802 A1 | 3/2008 | Lin | |
| 2008/0080235 A1 | 4/2008 | Tran | |
| 2008/0239813 A1 * | 10/2008 | Sekar | G11C 16/08 365/185.13 |
| 2011/0205812 A1 | 8/2011 | Kajigaya | |
| 2012/0081986 A1 | 4/2012 | Joo | |
| 2013/0021856 A1 | 1/2013 | Kajigaya | |
| 2014/0050017 A1 | 2/2014 | Otto et al. | |
| 2014/0269018 A1 | 9/2014 | Jin et al. | |
| 2016/0012868 A1 * | 1/2016 | Moon | G11C 7/065 365/189.11 |
| 2016/0196868 A1 | 7/2016 | Huang | |
| 2018/0182449 A1 | 6/2018 | Kim et al. | |
| 2019/0237135 A1 | 8/2019 | Madhavan et al. | |
| 2021/0005243 A1 | 1/2021 | Bae | |
| 2022/0310142 A1 * | 9/2022 | Su | G11C 7/08 |

FOREIGN PATENT DOCUMENTS

| | | |
|---|---|---|
| CN | 101009135 A | 8/2007 |
| CN | 101140798 A | 3/2008 |
| CN | 102394094 A | 3/2012 |
| CN | 101562042 B | 6/2012 |
| CN | 102881318 A | 1/2013 |
| CN | 103021455 A | 4/2013 |
| CN | 103123808 A | 5/2013 |
| CN | 103295626 A | 9/2013 |
| CN | 103474093 A | 12/2013 |
| CN | 103594111 A | 2/2014 |
| CN | 105144295 A | 12/2015 |
| CN | 105206298 A | 12/2015 |
| CN | 105976859 A | 9/2016 |
| CN | 205645282 U | 10/2016 |
| CN | 106205676 A | 12/2016 |
| CN | 106328191 A | 1/2017 |
| CN | 106782652 A | 5/2017 |
| CN | 107481754 A | 12/2017 |
| CN | 108257631 A | 7/2018 |
| CN | 109712651 A | 5/2019 |
| CN | 109841240 A | 6/2019 |
| CN | 111164691 A | 5/2020 |
| CN | 111739565 A | 10/2020 |
| CN | 111863049 A | 10/2020 |
| CN | 111863052 A | 10/2020 |
| CN | 111863053 A | 10/2020 |
| CN | 111863054 A | 10/2020 |
| CN | 111863055 A | 10/2020 |
| CN | 111899776 A | 11/2020 |
| CN | 112259149 A | 1/2021 |
| CN | 212303080 U | 1/2021 |
| CN | 112447208 A | 3/2021 |
| CN | 112466363 A | 3/2021 |
| CN | 112992200 A | 6/2021 |
| CN | 112992201 A | 6/2021 |
| CN | 112992202 A | 6/2021 |
| CN | 112992203 A | 6/2021 |
| CN | 113012729 A | 6/2021 |
| JP | S58102389 A | 6/1983 |
| KR | 20040003210 A | 1/2004 |
| TW | M358390 U | 6/2009 |
| WO | 2021036104 A1 | 3/2021 |

OTHER PUBLICATIONS

Rahul Sarpeshkar, John L. Wyatt, Jr., Nicky C. Lu, Porter D. Gerber, "Mismatch Sensitivity of A Simultaneously Latched CMOS Sense Amplifier", IEEE Journal of Solid-State Circuits, vol. 26, No. 10, pp. 1413-1422, 1991.
Ki Chul Chun et al, "A 3T Gain Cell Embedded DRAM Utilizing Preferential Boosting for High Density and Low Power On-Die Caches": IEEE, dram and power and write and driving, IEEE Journal of Solid-State Circuits, vol. 46, No. 6, Jun. 2011, 11 pages.
Notice of Allowance of the Chinese application No. 202110314431.5, issued on Apr. 13, 2022, 3 pages.
Suk Min Kim et al, "Sensing voltage compensation circuit for low-power dram bit-line sense amplifier": IEEE, dram and sense amplifier and power, School of Electrical and Electronic Engineering, Yonsei University, Seoul 03722, Korea, 4 pages.
Notice of Allowance of the Chinese application No. 202110313685.5, issued on Apr. 13, 2022, 5 pages.
Suk Min Kim et al, "Analysis on Sensing Yield of Voltage Latched Sense Amplifier for Low Power DRAM": IEEE, dram and offset and power, PRIME 2018, Prague, Czech Republic, Session: Circuits for Memories and Security, School of Electrical and Electronic Engineering Yonsei University Seoul 03722, Korea, 4 pages.
Notice of Allowance of the Chinese application No. 202110313695.9, issued on Apr. 13, 2022, 5 pages.
Notice of Allowance of the Chinese application No. 202110314336.5, issued on Apr. 13, 2022, 5 pages.

* cited by examiner

SENSE AMPLIFIER, MEMORY AND CONTROL METHOD

CROSS-REFERENCE TO RELATED APPLICATIONS

This is a continuation application of International Patent Application No. PCT/CN2021/107681, filed on Jul. 21, 2021, which claims priority to Chinese Patent Application No. 202110314347.3, filed to the State Intellectual Property Office of China on Mar. 24, 2021 and entitled "Sense Amplifier, Memory and Control Method". The disclosures of International Patent Application No. PCT/CN2021/107681 and Chinese Patent Application No. 202110314347.3 are hereby incorporated by reference in their entireties.

TECHNICAL FIELD

The disclosure relates, but is not limited, to a sense amplifier, a memory and a control method.

BACKGROUND

With the popularity of electronic devices such as mobile phones, tablets, personal computers and other, the semiconductor memory technology is also developing rapidly.

A Sense Amplifier (SA for short) is an important component of the semiconductor memory, and the main function of the SA is to amplify small signals on a bit line (BL), and then perform reading or writing operations. The SA includes a writing circuit and an amplifying circuit, and when data is written into a storage unit, the writing circuit and the amplifying circuit both may pull the voltage of the BL and the voltage of a bit line benchmark (BLB).

However, if the drive capability of the writing circuit is weak relatively to that of the amplifying circuit, the writing circuit cannot pull the voltage of the BL and the voltage of the BLB according to data to be written, so that the SA cannot flip, thereby resulting in the data write failure.

SUMMARY

Embodiments of the disclosure provide an SA, which includes an amplifying module, a controllable power module and a writing module.

The amplifying module is configured to amplify voltage difference between a BL and a BLB when the SA is in an amplifying stage.

The controllable power module is connected to the amplifying module and configured to stop providing power to the amplifying module when the SA is a writing stage, to enable the amplifying module to stop working.

The writing module is connected to the BL and the BLB, and configured to pull the voltage difference between the BL and the BLB according to data to be written when the SA is in a writing stage.

Embodiments of the disclosure further provide a memory, which includes an SA n the above embodiment of the disclosure and storage units.

A plurality of storage units form a first storage array, a plurality of storage units form a second storage array, the SA is located between the first storage array and the second storage array, a third end of the SA is connected to a BL of the first storage array, and a fourth end of the SA is connected to a BLB of the second storage array.

Embodiments of the disclosure further provide a method for controlling an SA. The SA includes an amplifying module, a controllable power module and a writing module, and the method includes the following operations.

A working state where the SA is located is obtained, and the working state includes a writing stage.

When the working state is the writing stage, a first control signal is generated.

The first control signal is used for controlling the controllable power module to stop providing power to the amplifying module, to enable the amplifying module to stop working, and enable the writing module to pull the voltage difference between the BL and the BLB according to data to be written when the SA is in the writing stage.

DETAILED DESCRIPTION

In order to make the objective, technical solution and advantages of the disclosure clearer, the technical solutions in the disclosure are clearly and completely described below in combination with the drawings. It is apparent that the described embodiments are not all embodiments but part of embodiments of the disclosure. All other embodiments obtained by those of ordinary skill in the art based on the embodiments in the disclosure without creative work shall fall within the scope of protection of the disclosure.

Figure 1:
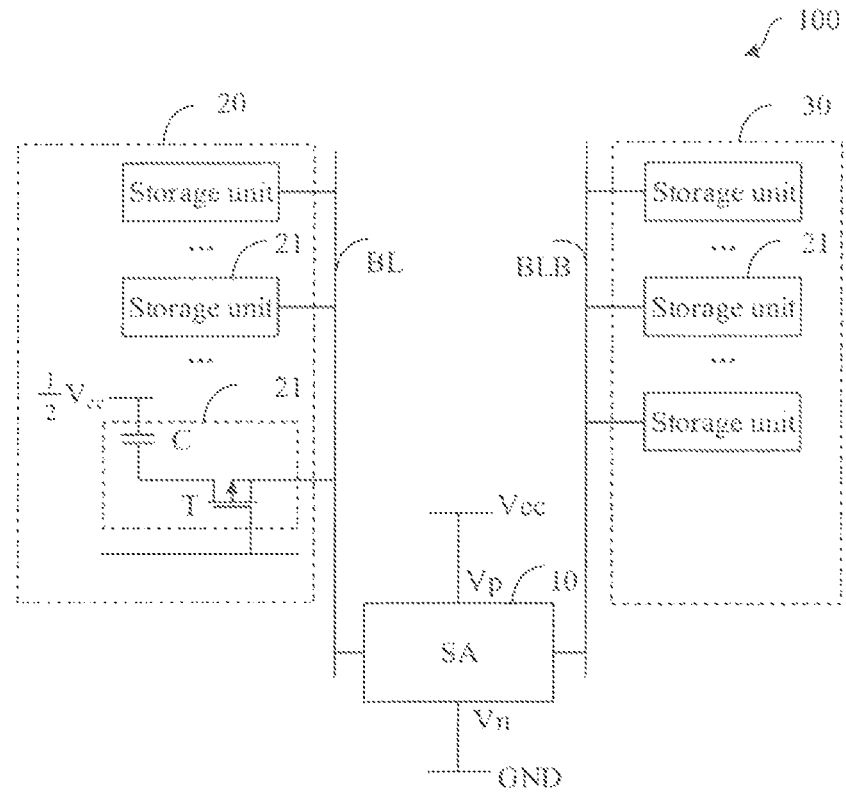
FIG. 1 is a structural schematic diagram of a memory according to an embodiment of the disclosure.

As shown in FIG. 1, an embodiment of the disclosure provides a memory 100, which includes an SA 10 and a plurality of storage units 21. The plurality of storage units 21 form a first storage array 20, and the plurality of storage units 21 form a second storage array 30. Each storage unit 21 in the first storage array 20 is connected to the bit line (BL) of the first storage array 20, and each storage unit 21 in the second storage array 30 is connected to the BL of the second storage array 30.

The SA 10 is located between the first storage array 20 and the second storage array 30. A first end Vp of the SA 10 is connected to a first power supply end Vcc, a second end Vn of the SA 10 is connected to a second power supply end (GND), a third end of the SA 10 is connected to the BL of the first storage array 20, and a fourth end of the SA 10 is connected to the BL of the second storage array 30.

Each storage unit 21 is configured to store single-bit data, the BL of the first storage array 20 is configured to access the data stored in each storage unit 21 of the first storage array 20, and the BL of the second storage array 30 is configured to access the data stored in each storage unit 21 of the second storage array 30. The SA 10 is configured to amplify the data stored in various storage units 21 and present the data on the BL of the first storage array 20 and the BL of the second storage array 30. The SA 10 is also configured to recover the storage unit 21 to the state before the reading operation after the data reading operation is completed.

Each storage unit 21 includes a storage capacitor C and an access transistor T. A first end of the storage capacitor C is connected to a charging power $0.5V_{CC}$, a second end of the storage capacitor C is connected to a first end of the access transistor T, a second end of the access transistor T is connected to the BL, and a control end of the access transistor T is connected to a word line.

The amount of the charge stored in the storage capacitor C or the value of the voltage difference between the two ends of the storage capacitor C may indicate logic 1 or logic 0. The access transistor T is configured to control whether the reading or rewriting operation performed on the information stored in the storage capacitor C is allowed or prohibited.

For convenient description, when data is written into a storage unit 21 in the first storage array 20, the BL of the first storage array 20 is called as the BL, and the BL of the second storage array 30 is called as the Bit Line Benchmark (BLB). When data is written into a storage unit 21 in the second storage array 30, the BL of the second storage array 30 is called as the BL and the BL of the first storage array 20 is called as the BLB.

The SA is usually configured with a writing circuit and an amplifying circuit. The writing circuit pulls the voltage of the BL and the voltage of the BLB, and then the BL charges the storage capacitor in the storage unit or the storage capacitor discharges the BL, so as to implement data writing.

Figure 2:
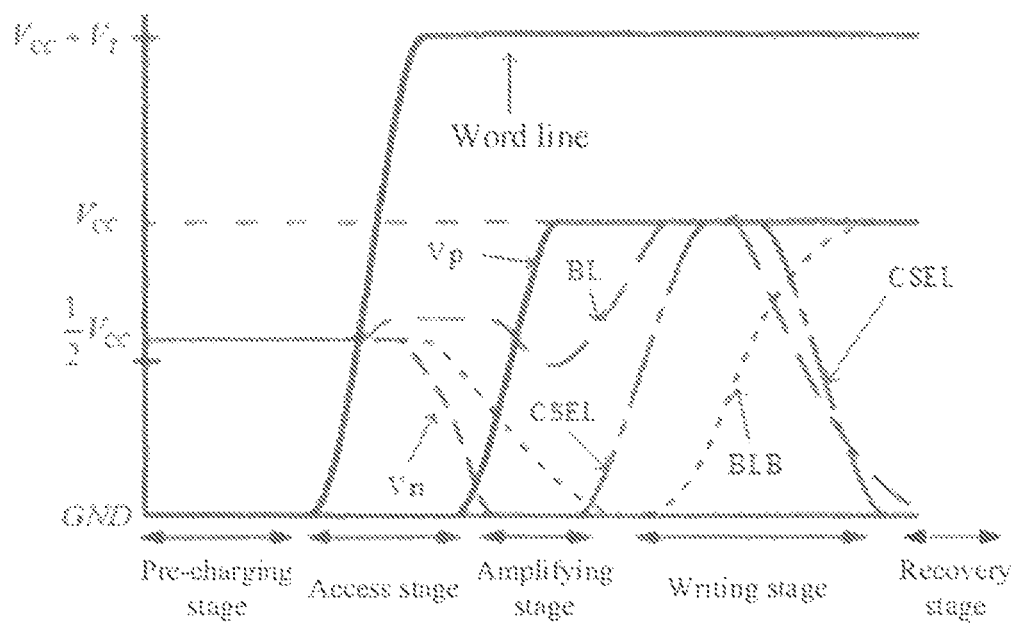
FIG. 2 is a sequence diagram of writing data according to another embodiment of the disclosure.

The process that the SA writes the data "0" in one storage unit 21 of the first storage array 20 is described below in combination with FIG. 2. The operation of writing data includes a pre-charging stage, an access stage, an amplifying stage, a writing stage and a recovery stage.

In the pre-charging stage, the voltage of the BL and the voltage of the BLB of the first storage array 20 are pulled up to the charging voltage $0.5 V_{CC}$ by a charging power supply.

In the access stage, a signal in the word line corresponding to the accessed storage unit 21 is controlled, to enable the access transistor T in the accessed storage unit 21 to be turned on. The storage capacitor C changes the voltage of the BL, for example, if the data stored in the storage capacitor C is "1", the voltage of the BL is increased through the storage capacitor C.

In the amplifying stage, the voltage of the BL is higher than a reference voltage, and the amplifying circuit pulls the voltage of the BL upwards and pulls the voltage of the BLB downwards, thereby amplifying the voltage difference between the BL and the BLB.

In the writing stage, a column selection signal is controlled, and the voltage of the BLB is pulled by a writing circuit according to a voltage corresponding to the logic data "0", namely, the voltage of the BLB is pulled up, so that the voltage of the BL is lower than that of the BLB.

In the recovery stage, the SA 10 stabilizes the voltage of the BL and the voltage of the BLB at the logic data "0", when the BL also charges the storage capacitor C (when the BL is "1", the current flows to the storage capacitor C from the BL, when the BL is "0", the current flows to the BL from the storage capacitor C, and charging herein shows the above two current directions), the data "0" is written into the storage capacitor C after charging for a period of time. The access transistor is turned off through controlling the signal in the word line, and then the writing of the logic data "0" is completed.

It is to be noted that the process of writing the data in the storage unit may only include a pre-charging stage, a writing stage and a recovery stage, and no limitations are made herein.

However, the writing circuit and the amplifying circuit may pull the voltage of the BL and the voltage of the BLB during the process of writing data in the storage unit 21. If the drive capability of the writing circuit is weak relatively to that of the amplifying circuit, the writing circuit cannot pull the voltage of the BL and the voltage of the BLB according to the data to be written, so that the SA cannot turn flip, thereby resulting in the data write failure.

Figure 3:
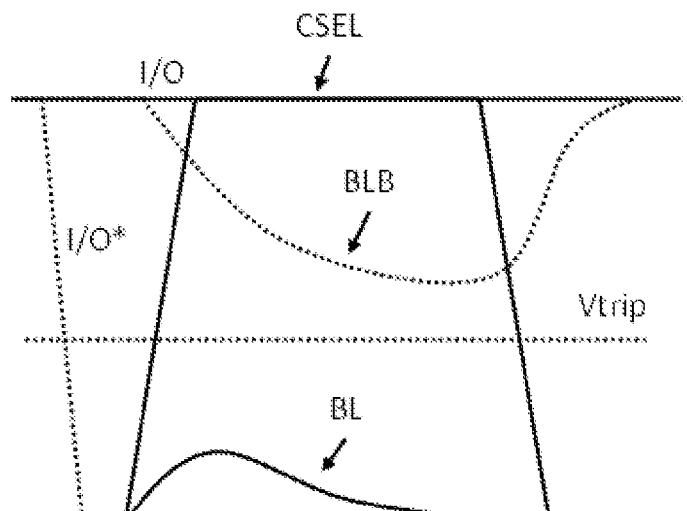
FIG. 3 is a schematic diagram of failure of writing data when a writing module has weaker drive capability.

For example, as shown in FIG. 3, when the logic data "1" is written into the storage unit by using the writing circuit I/O and I/O*, the descended voltage of the BLB is insufficient after the column selection signal is enabled, so a reverse point voltage Vtrip of a reverser composed of a N-type transistor and a P-type transistor in the amplifying circuit cannot be achieved, positive feedback cannot be formed to turn over the SA, and the data to be written cannot be stably presented on the BL and the BLB, thereby resulting in the write failure.

In order to solve the above technical problems, the disclosure provides an SA, a memory and a control method, which can ensure to successfully write data in a storage unit in a case that the writing circuit has weak drive capability. The technical concept of the disclosure is that the power to the amplifying module is stopped in the writing stage of the SA, namely, a power end of the amplifying module is floated, the amplifying module stops pulling the voltage of the BL and the voltage of the BLB, then the writing module 103 separately pulls the voltage of the BL and the voltage of the BLB. Without the influence of the amplifying module, the data may be successfully written in the storage unit when the drive capability of the writing module 103 is relatively weak.

Figure 4:
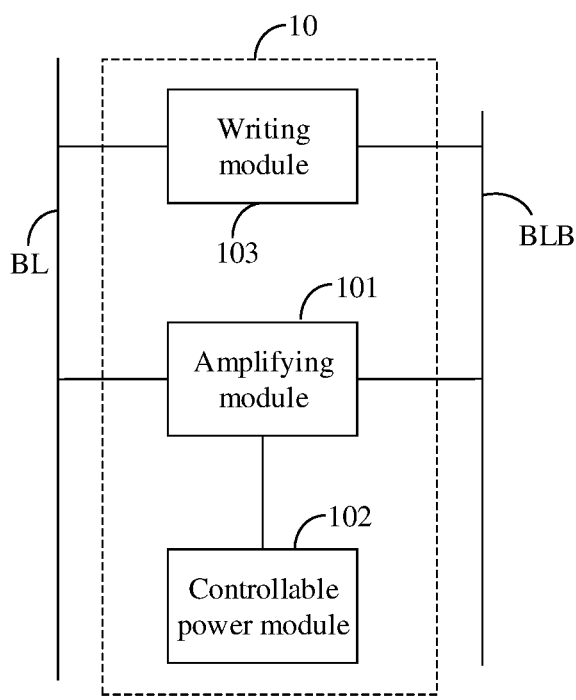
FIG. 4 is a circuit structure diagram of an SA according to another embodiment of the disclosure.

As shown in FIG. 4, an embodiment of the disclosure provides an SA 10, which includes an amplifying module 101, a controllable power module 102 and a writing module 103. The amplifying module 101 is connected to the controllable power module 102, and connected to the BL and the BLB, and the writing module 103 is connected to the BL and the BLB.

The amplifying module 101 is configured to amplify the voltage difference between the BL and the BLB when the SA 10 is in an amplifying stage. The controllable power module 102 is configured to stop providing the power to the amplifying module 101 when the SA 10 is in the writing stage, to enable the amplifying module 101 to stop working. The writing module 103 is configured to pull the voltage difference between the BL and the BLB according to the data to be written when the SA 10 is in a writing stage.

When the SA 10 is in the writing stage, the controllable power module 102 stops providing the power to the amplifying module 101, the power end of the amplifying module 101 is floated, so that the amplifying module 101 stops working, and the amplifying module 101 has no influence on the voltage of the BL and the voltage of the BLB in the writing stage. At this time, the writing module 103 pulls the voltage of the BL and the BLB according to the data to be written. If the written data is the logic data "1", the voltage of the BL is pulled up, and the voltage of the BLB is pulled down. If the written data is the logic data "0", the voltage of the BLB is pulled up, and the voltage of the BL is pulled down. Due to stopping of the influence of the amplifying module 101 on the voltage of the BL and the voltage of the BLB in the writing stage, the data to be written may be stably and successfully presented on the BL and the BLB when the drive capability of the writing module 103 is lower than that of the amplifying module 101, and then the access transistor T in the storage unit 21 is controlled, so that charging and discharging are performed between the storage capacitor C in the storage unit 21 and the BL, thereby writing the data to be written in the storage unit.

In the above technical solution, the controllable power module stops supplying power to the amplifying module in the writing stage, the amplifying module cannot pull the voltage of the BL and the voltage of the BLB, so that only the writing module may pull the voltage of the BL and the voltage of the BLB in the writing stage, and then the data to be written may be successfully presented on the BL and the BLB when the drive capability of the writing module is weak, thereby successfully writing data in the storage unit.

Figure 5:
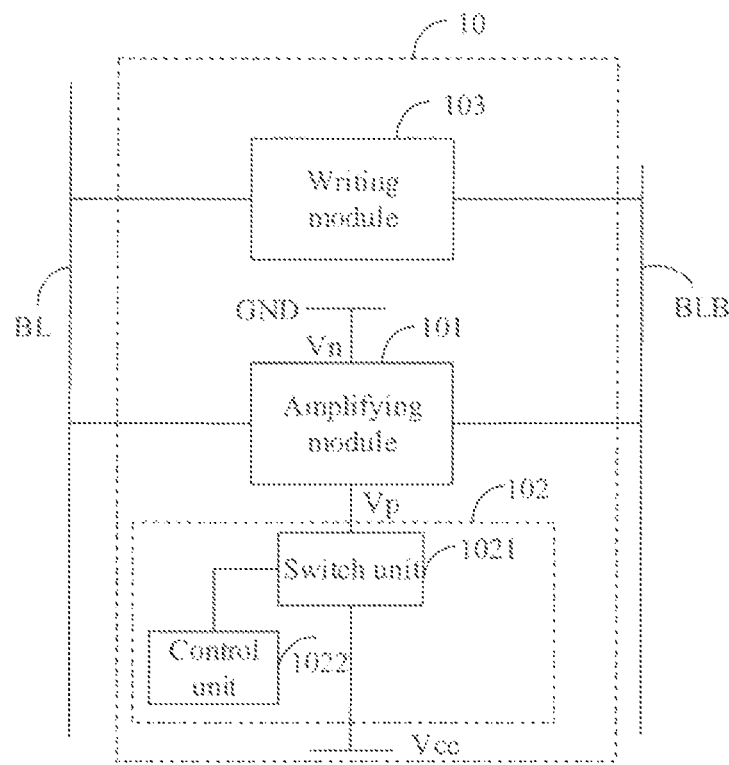
FIG. 5 is a circuit structure diagram of an SA according to another embodiment of the disclosure.

As shown in FIG. 5, another embodiment of the disclosure provides an SA 10, which includes an amplifying module 101, a controllable power module 102 and a writing module 103. The amplifying module 101 is connected to the controllable power module 102, and connected to the BL and the BLB, and the writing module 103 is connected to the BL and the BLB.

The amplifying module 101 is configured to amplify the voltage difference between the BL and the BLB when the SA is in an amplifying stage. The controllable power module 102 is configured to stop providing power to the amplifying module 101 when the SA 10 is in a writing stage, to enable the amplifying module 101 to stop working. The controllable power module 102 is also configured to provide power to the amplifying module 101 when the SA 10 is in a recovery stage, to enable the amplifying module 101 to continue to work. The writing module 103 is configured to pull the voltage difference between the BL and the BLB according to data to be written when the SA 10 is in the writing stage.

The process that the SA writes the data "1" in one storage unit 21 of the first storage array 20 is described below. The operation of writing data includes a pre-charging stage, an access stage, an amplifying stage, a writing stage and a recovery stage. It is assumed that "0" is stored in the storage unit 21 before writing.

In the pre-charging stage, the controllable power module 102 stops providing power to the amplifying module 101, the amplifying module 101 dose not pull the voltage of the BL and the voltage of the BLB, and the voltage of the BL and the voltage of the BLB of the first storage array 20 are pulled to 0.5 $V_{CC}$ by a charging power supply.

The controllable power module 102 may recover to supply power to the amplifying module 101 in the access stage, and may also recover to supply power to the amplifying module 101 in the amplifying stage. In addition, a signal in the word line corresponding to the accessed storage unit 21 is controlled, to enable the access transistor T in the accessed storage unit 21 to be turned on. The storage capacitor C changes the voltage of the BL, for example, if the data stored in the storage capacitor C is "0", the storage capacitor C causes the voltage of the BL to drop, namely, the BL charges the storage capacitor C, and the current flows from the BL to the storage capacitor C.

In the amplifying stage, the voltage of the BL is less than a reference voltage, the controllable power module 102 provides power to the amplifying module 101, so that the amplifying module 101 may pull the voltage of the BL and the voltage of the BLB, and then amplify the voltage difference between the BL and the BLB.

In the writing stage, the controllable power module 102 stops providing power to the amplifying module 101, and the amplifying module 101 no longer pulls the voltage of the BL and the voltage of the BLB. In addition, a column selection signal is controlled, the voltage of the BL and the voltage of the BLB are pulled by the writing circuit according to the voltage corresponding to the logic data "1", namely, the voltage of the BL is pulled up, and the voltage of the BLB is pulled down, so that the voltage of the BL is higher than that of the BLB.

In the recovery stage, the controllable power module 102 continues to provide power to the amplifying module 101, and the amplifying module 101 amplifies the voltage difference between the BL and the BLB and stabilizes the voltage difference at the logic data "1", the BL also charges the storage capacitor C, and after charging for a period of time, the data "1" is written in the storage capacitor C. Then, the access transistor is turned off through controlling the signal in the word line, and the writing of the logic data "0" is completed.

If the operation of writing data only includes the pre-charge stage, the writing stage and the recovery stage, the above description may be referred to, which are not elaborated herein.

In another embodiment, the controllable power module 102 may include a switch unit 1021 and a control unit 1022. The switch unit 1021 has a first end, a second end and a control end. The first end of the switch unit 1021 is connected to a first power supply end Vcc, the second end of the switch unit 1021 is connected to a first end of the amplifying module 101, and the control end of the switch unit 1021 is connected to the control unit 1022. A second end of the amplifying module 101 is grounded (GND), a third end of the amplifying module 101 is connected to the BL of the first storage array, and a fourth end of the amplifying module 101 is connected to the BL of the second storage array.

The control unit 1022 is configured to generate a first control signal when the SA 10 is in a writing stage, the first control signal is configured to control the switch unit 1021 to be disconnected, so that the first power supply end Vcc cannot continue to supply power to the amplifying module 101 and the amplifying module 101 stops working, and then the amplifying module cannot continue to pull the voltage of the BL and the voltage of the BLB in the writing stage. At this time, the writing module 103 pulls the voltage of the BL and the voltage of the BLB according to the data to be written. The control unit 1022 is also configured to generate a second control signal when the SA 10 is in the recovery stage, and the second control signal is configured to control the switch unit 1021 to be closed, so that the power supply end provides power to the amplifying module 101 and the amplifying module 101 continues to work. In this way, the amplifying module 101 may continue to pull the voltage of the BL and the voltage of the BLB in the recovery stage, so that the data to be written may be stably presented on the BL and the BLB.

In the above technical solution, the control unit controls the switch unit to be turned on or off, so as to control whether the power supply end provides power to the amplifying module. By making the switch unit to be turned off in the writing stage, the amplifying module cannot pull the voltage of the BL and the voltage of the BLB again, so that the voltage of the BL and the voltage of the BLB may be pulled according to the data to be written when the drive capability of the writing module is relatively weak, thereby writing the data to be written in the storage unit.

Figure 6:
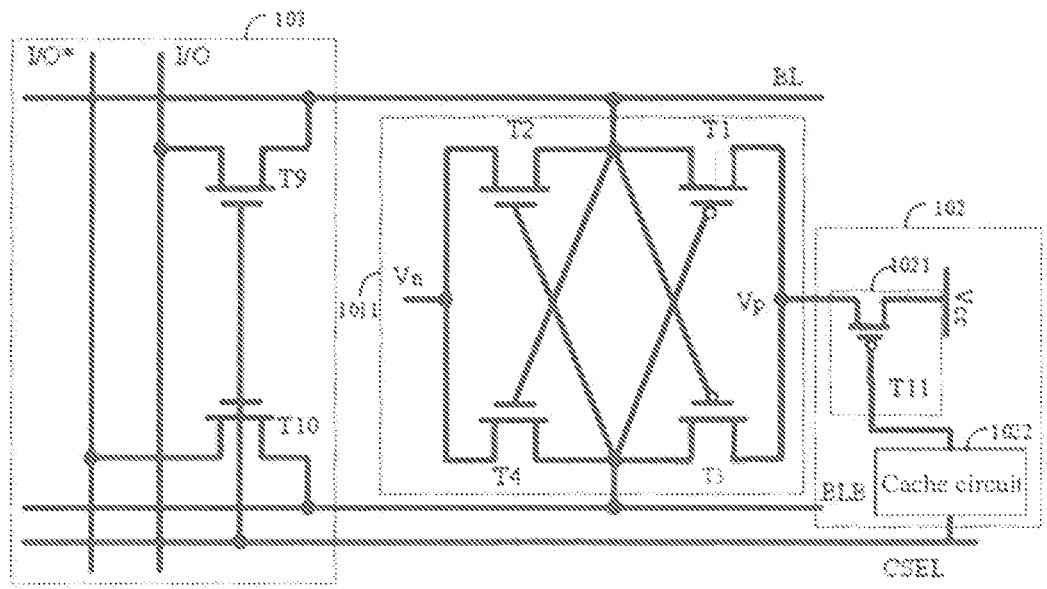
FIG. 6 is a circuit structure diagram of an SA according to another embodiment of the disclosure.

As shown in FIG. 6, another embodiment of the disclosure provides an SA, which includes an amplifying module 101, a controllable power module 102 and a writing module 103. The amplifying module 101 is connected to the controllable power module 102, and connected to the BL and the BLB, and the writing module 103 is connected to the BL and the BLB.

The amplifying module 101 includes at least one cross coupling amplifying circuit 1011. Each cross coupling amplifying circuit has a first end Vp, a second end Vn, a third end and a fourth end. The first end Vp of the cross coupling amplifying circuit 1011 is connected to an output end of the controllable power module 102, the second end Vn of the cross coupling amplifying circuit 1011 is grounded, the third end of the cross coupling amplifying circuit 1011 is connected to the BL, and the fourth end of the cross coupling amplifying circuit 1011 is connected to the BLB.

The cross coupling amplifying circuit 1011 includes a first transistor T1, a second transistor T2, a third transistor T3 and a fourth transistor T4.

A first end of the first transistor T1 is the first end Vp of the cross coupling amplifying circuit 1011, a second end of the second transistor T2 is the second end Vn of the cross coupling amplifying circuit 1011, a second end of the first transistor T1 is the third end of the cross coupling amplifying circuit 1011, and a second end of the third transistor T3 is the fourth end of the cross coupling amplifying circuit 1011.

A second end of the first transistor T1 is connected to a first end of the second transistor T2, the second end of the third transistor T3 is connected to a first end of the fourth transistor T4, the first end of the first transistor T1 is connected to a first end of the third transistor T3, and the second end of the second transistor T2 is connected to a second end of the fourth transistor T4.

The control end of the first transistor T1 is connected to the second end of the third transistor T3, the control end of the second transistor T2 is connected to the second end of the third transistor T3, the control end of the third transistor T3 is connected to the second end of the first transistor T1, and the control end of the fourth transistor T4 is connected to the second end of the first transistor T1.

The controllable power module 102 includes a switch unit 1021 and a control unit 1022. The switch unit 1021 includes an eleventh transistor T11, a first end of the eleventh transistor T11 is connected to the power supply end, a second end of the eleventh transistor T11 is connected to the first end Vp of the cross coupling amplifying circuit 1011, and the control end of the eleventh transistor T11 is connected to the control unit 1022.

The control unit 1022 includes a cache circuit. An input end of the cache circuit is connected to a column selection line (CSEL) and an output end of the cache circuit is connected to the control end of the switch unit 1021. The cache circuit is configured to perform cache processing on the column selection signal and then output a control signal for controlling the switch unit 1021.

The writing module 103 includes a ninth transistor T9 and a tenth transistor T10, a second end of the ninth transistor T9 is configured to receive data to be written, a first end of the ninth transistor T9 is connected to the BL, and a control end of the ninth transistor T9 is connected to the column selection line CSEL. The ninth transistor T9 is configured to pull the voltage of the BL according to the data to be written.

A second end of the tenth transistor T10 is configured to receive the data to be written, a first end of the tenth transistor T10 is connected to the BLB, and a control end of the tenth transistor T10 is connected to the column selection line CSEL. The tenth transistor T10 is configured to pull the voltage of the BLB according to the data to be written.

The first transistor T1 and the third transistor T3 are P-type transistors, and the second transistor T2 and the fourth transistor T4 are N-type transistors. The ninth transistor and the tenth transistor are N-type transistors, and the eleventh transistor is a P-type transistor.

Figure 7:
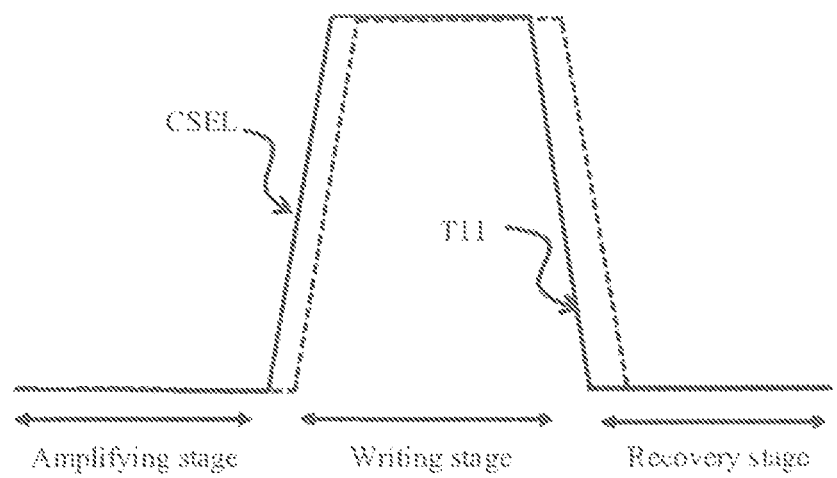
FIG. 7 is a schematic diagram of a relationship between a control signal and a column selection signal according to another embodiment of the disclosure.
Figure 8:
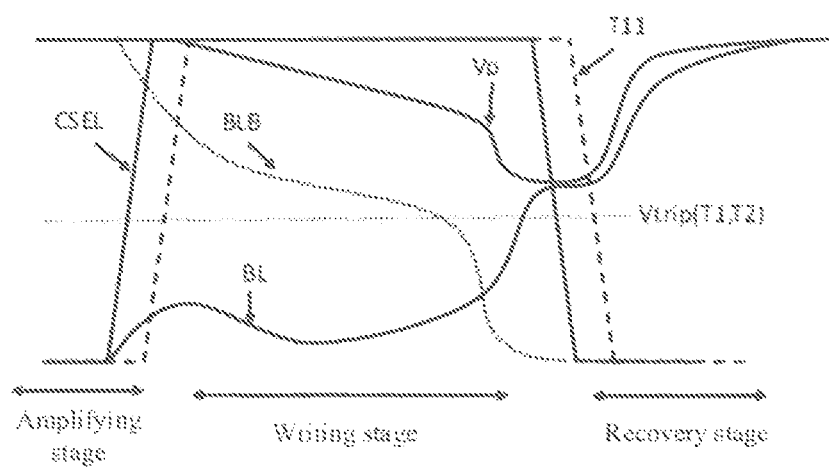
FIG. 8 is a schematic diagram of voltage change of an SA according to another embodiment of the disclosure.

The process of writing the data in the storage unit by the SA 10 is described below in combination with FIG. 7 and FIG. 8.

The column selection signal is at a high level in the writing stage and at a low level in the amplifying stage and the recovery stage. After the cache processing, the column selection signal is at the high level in the writing stage and at the low level in the amplifying stage and recovery stage.

In the pre-charging stage, the voltages of the BL and the BLB of the first storage array 20 are pulled to the reference voltage by the charging power supply.

In the amplifying stage, when the control signal is at the low level, the eleventh transistor T11 is closed, and the power supply end supplies power to the amplifying module 101, so that the amplifying module 101 may pull the voltage of the BL and the voltage of the BLB, and then amplify the voltage difference between the BL and the BLB.

In the writing stage, when the control signal is at the high level, the eleventh transistor T11 is open, and the power supply end stops supplying power to the amplifying module 101. The column selection signal is at the high level, and when the written data is "1", the ninth transistor T9 and the tenth transistor T10 are turned on, and the ninth transistor T9 pulls the voltage of the BL up. When the written data is "0", the tenth transistor T10 and the ninth transistor T9 are turned on, and the tenth transistor T10 pulls the voltage of the BLB up.

In the recovery stage, when the control signal is at the low level, the eleventh transistor T11 is closed, and the power supply end Vcc supplies power to the amplifying module 101. The amplifying module 101 stabilizes the voltage of the BL and the voltage of the BLB at the data to be written, the BL also charges the storage capacitor C, and after charging for a period of time, the data to be written is written into the storage capacitor C. The access transistor is turned off through controlling a signal in the word line, and then the data writing is completed.

In the above process, the amplifying module stops working in the writing stage, the voltage of the BLB is pulled to the reverse point voltage Vtrip after the column selection signal is enabled, so as to form positive feedback to turn over the SA. The data to be written may be stably presented on the BL and the BLB, thereby realizing successful data writing when the drive capability is relatively weak.

In the above technical solutions, the control signal for the switch unit is generated according to the column selection signal, so that the power supply to the amplifying module is stopped in the writing stage and recovered in the recovery stage. The structure of the control unit is simplified while ensuring to successfully write the data, and the reliability of the SA is improved.

Figure 9:
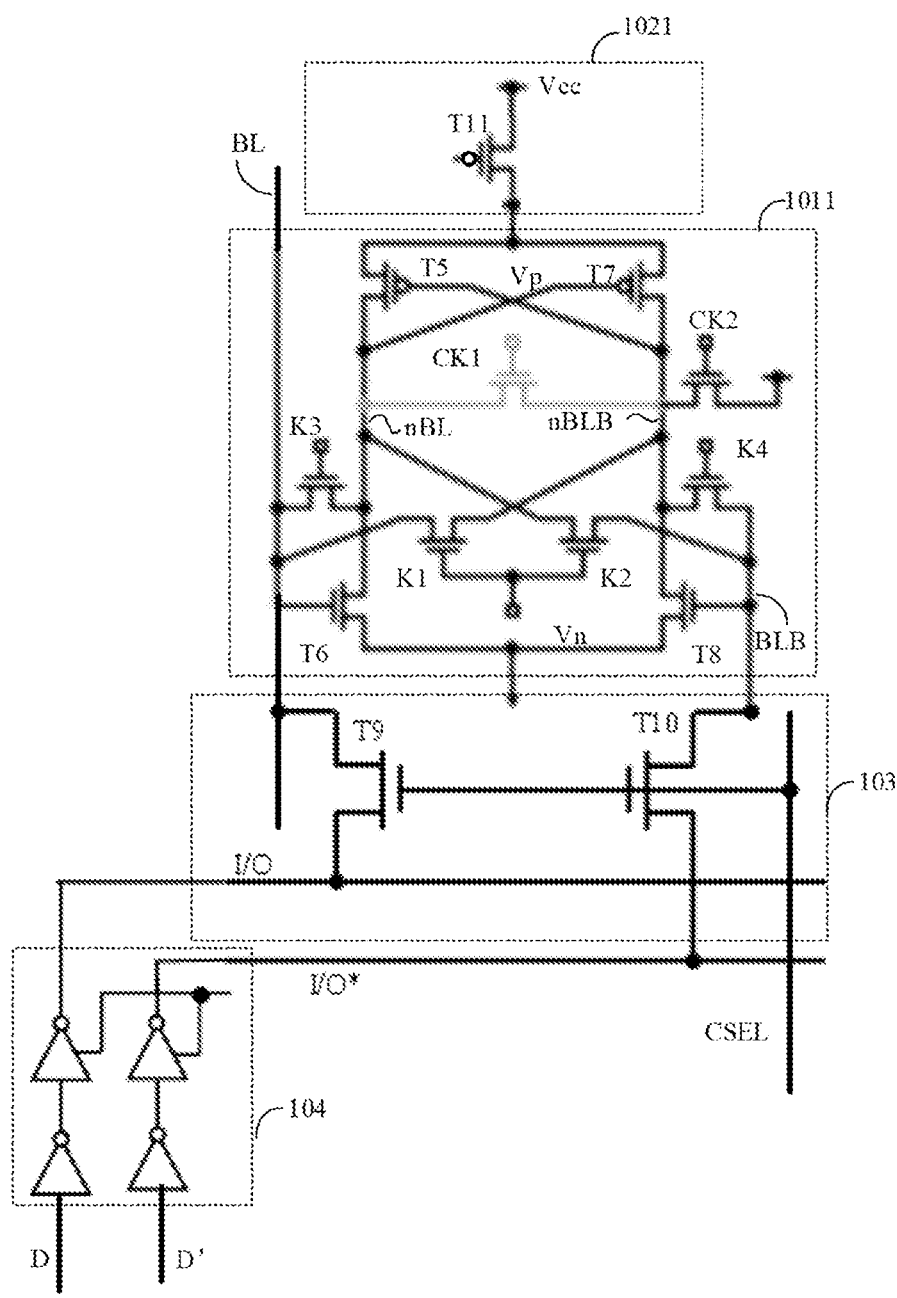
FIG. 9 is a circuit structure diagram of an SA according to another embodiment of the disclosure.

As shown in FIG. 9, another embodiment of the disclosure provides an SA 10, which includes an amplifying module 101, a controllable power module 102, a writing module 103 and a drive module 104. The amplifying module 101 is connected to the controllable power module 102, the writing module 103 is connected to the BL, the writing module 103 is also connected to the BLB, and the drive module 104 is connected to the writing module 103.

The amplifying module 101 includes at least one cross coupling amplifying circuit 1011. Each cross coupling amplifying circuit 1011 is provided with a first end Vp, a second end Vn, a third end and a fourth end. The first end Vp of the cross coupling amplifying circuit 1011 is connected to an output end of the controllable power module 102, the second end Vn of the cross coupling amplifying circuit is grounded, the third end of the cross coupling amplifying circuit 1011 is connected to the BL, and the fourth end of the cross coupling amplifying circuit 1011 is connected to the BLB.

The cross coupling amplifying circuit 1011 is a single-cross coupling amplifying circuit and has an offset elimination function. The cross coupling amplifying circuit 1011 specifically includes a fifth transistor T5, a sixth transistor T6, a seventh transistor T7, an eighth transistor T8, a first switch K1, a second switch K2, a third switch K3 and a fourth switch K4.

A first end of the fifth transistor T5 is the first end Vp of the cross coupling amplifying circuit 1011, a second end of the sixth transistor T6 is the second end Vn of the cross coupling amplifying circuit 1011, a second end of the fifth transistor T5 is the third end of the cross coupling amplifying circuit 1011, and a second end of the seventh transistor T7 is the fourth end of the cross coupling amplifying circuit 1011.

A second end of the fifth transistor T5 is connected to a first end of the sixth transistor T6, the second end of the seventh transistor T7 is connected to a first end of the eighth transistor T8, the first end of the fifth transistor T5 is connected to a first end of the seventh transistor T7, and a second end of the sixth transistor T6 is connected to a second end of the eighth transistor T8.

A control end of the fifth transistor T5 is connected to the second end of the seventh transistor T7. A control end of the sixth transistor T6 is connected to the second end of the seventh transistor T7 through the first switch K1, and connected to the first end of the sixth transistor T6 through the third switch K3.

A control end of the seventh transistor T7 is connected to the second end of the fifth transistor T5. A control end of the eighth transistor T8 is connected to the second end of the fifth transistor T5 through the second switch K2, and connected to the first end of the eighth transistor T8 through the fourth switch K4.

The controllable power module 102 includes a switch unit 1021 and a control unit 1022. The switch unit 1021 includes an eleventh transistor T11. A first end of the eleventh transistor T11 is connected to the power supply end Vcc, a second end of the eleventh transistor T11 is connected to the first end Vp of the cross coupling amplifying circuit 1011, and a control end of the eleventh transistor T11 is connected to the control unit.

The writing module 103 includes a ninth transistor T9 and a tenth transistor T10. A second end of the ninth transistor T9 is configured to receive the data to be written, a first end of the ninth transistor T9 is connected to the BL, and a control end of the ninth transistor T9 is connected to the column selection line CSEL. The ninth transistor T9 is configured to pull the voltage of the BL according to the data to be written.

A second end of the tenth transistor T10 is configured to receive the data to be written, a first end of the tenth transistor T10 is connected to the BLB, and a control end of the tenth transistor T10 is connected to the column selection line CSEL. The tenth transistor T10 is configured to pull the voltage of the BLB according to the data to be written.

The fifth transistor T5, the seventh transistor T7 and the eleventh transistor T11 are P-type transistors, and the sixth transistor T6, the eighth transistor T8, the ninth transistor T9 and the tenth transistor T10 are N-type transistors.

The drive module includes two sets of inverters, and each set of inverters include two cascaded inverters. One set of inverters is connected to the second end of the ninth transistor, and the other set of inverters is connected to the second end of the tenth transistor. One set of inverters is configured to receive the data D to be written, and the other set of inverters is configured to receive the inverted data D' to be written.

The process that the SA 10 writes the data into the storage unit 21 is described below. For convenient description, the connecting line between the second end of the fifth transistor T5 and the first end of the sixth transistor T6 is called as an inner bit line (nBL) of the first storage array 20, and the connecting line between the second end of the seventh transistor T7 and the first end of the eighth transistor T8 is called as an inner bit line benchmark (nBLB) in the first storage array 20.

In the idle stage, the first switch K1 to the fourth switch K4 are all closed. The control end of the sixth transistor T6 is connected to the second end of the seventh transistor T7, and the control end of the sixth transistor T6 is connected to the first end of the sixth transistor T6. The control end of the eighth transistor T8 is connected to the second end of the fifth transistor T5, and the control end of the eighth transistor T8 is connected to the first end of the eighth transistor T8. The charging switches CK1 and CK2 are closed, and the inner bit line nBL and the inner bit line benchmark nBLB are charged by a charging power supply. In an embodiment, the BL, the BLB, the nBL, and the nBLB are charged to $0.5V_{CC}$.

In the offset eliminating stage, the control signal is at a low level, the eleventh transistor T11 is closed, and the power supply end Vcc supplies power to the amplifying module 101. The first switch K1 and the second switch K2 are open, and the third switch K3 and the fourth switch K4 are closed. The first end of the sixth transistor T6 is connected to the control end of the sixth transistor T6, the first end of the eighth transistor T8 is connected to the control end of the eighth transistor T8, the two N-type transistors are connected through a diode, and the two P-type transistors form a cross coupling inverter. Due to the manufacturing difference between the two transistors connected through the diode, a compensation voltage is generated on the BL and the BLB, The compensation voltage may eliminate the difference in the transistor manufacturing for the N-type transistor or the P-type transistor.

In the pre-charging stage, the first switch K1 to the fourth switch K4 are all open. The voltage of the nBL and the voltage of the nBLB of the first storage array 20 are pulled up to the reference voltage, and the reference voltage is a voltage of a fixed power supply connected to the storage capacitor C. In an embodiment, the voltage of the fixed power supply is $0.5\ V_{CC}$.

In the writing stage, when the control signal is at a high level, the eleventh transistor T11 is open, and the power supply end stops supplying power to the amplifying module 101. The first switch K1 to the fourth switch K4 are all open. The column selection signal is at the high level, and when the written data is "1", the ninth transistor T9 and the tenth transistor T10 are turned on, the ninth transistor T9 pulls the voltage of the BL up, and the tenth transistor T10 pulls the voltage of the BLB down. When the written data is "0", the tenth transistor T10 and the ninth transistor T9 are turned on, the ninth transistor T9 pulls the voltage of the BL down, and the tenth transistor T10 pulls the voltage of the BLB up.

In the recovery stage, the first control signal is at the low level, the eleventh transistor T11 is closed, and the power supply end Vcc supplies power to the amplifying module 101. The first switch K1 and the second switch K2 are closed, and the third switch K3 and the fourth switch K4 are open. The two P-type transistors form a cross coupling inverter, and the two N-type transistor also form a cross coupling inverter. The amplifying module 101 stabilizes the voltage of the BL and the voltage of the BLB at the data to be written, the BL also charges the storage capacitor C, and after charging for a period of time, the data to be written is written into the storage capacitor C. The access transistor is turned off through controlling a signal in the word line, and then the data writing is completed.

In the above technical solutions, the control unit controls the switch unit to be closed or open, so as to control whether the power supply end supplies power to the amplifying module. By turning off the switch units in the writing stage, the amplifying module cannot pull the voltage of the BL and the voltage of the BLB, so that the voltage of the BL and the voltage of the BLB may be pulled according to the data to be written when the drive capability of the writing module is relatively weak, thereby writing the data to be written into the storage unit.

Figure 10:
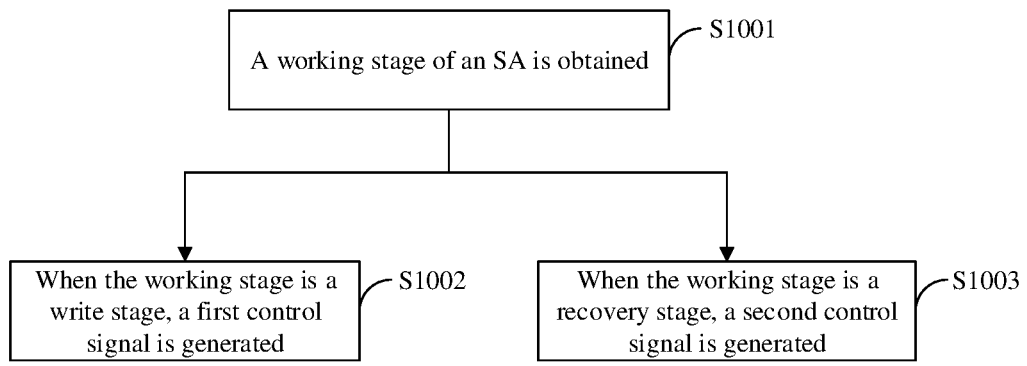
FIG. 10 is a schematic flowchart of a method for controlling an SA according to another embodiment of the disclosure.

As shown in FIG. 10, an embodiment of the disclosure provides a control method for controlling an SA 10. The structure of the SA has been described in details in the above embodiments, which are not elaborated herein. The control method includes the following operations.

At S1001, a working state of the SA is obtained.

The working state includes a writing stage and a recovery stage.

At S1002, when the working state is the writing stage, a first control signal is generated.

The first control signal is generated in the writing stage, and configured to control the controllable power module to stop providing the power to the amplifying module, to enable the amplifying module to stop working, and enable the writing module to pull the voltage difference between the BL and the BLB according to the data to be written when the SA is in the writing stage.

At S1003, when the working state is the recovery stage, a second control signal is generated.

The second control signal is generated in the recovery stage, and configured to control the controllable power module to supply power to the amplifying module continuously, to enable the amplifying module to continue to work. The amplifying module stabilizes the voltage of the BL and the BLB at the data to be written, the BL also charges the storage capacitor, and after charging for a period of time, the data to be written is written into the storage capacitor.

In the above technical solution, the controllable power module stops supplying power to the amplifying module in the writing stage, the amplifying module cannot pull the voltage of the BL and the BLB, so that only the writing module can pull the voltage of the BL and the voltage of the BLB in the writing stage. Therefore, the data to be written may be successfully presented on the BL and the BLB when the drive capability of the writing module is weak, thereby successfully writing the data into the storage unit.

Finally, it is to be noted that the foregoing embodiments are merely intended for describing the technical solutions of the disclosure, but not for limiting the disclosure. Although the disclosure is described in detail with reference to the foregoing embodiments, persons of ordinary skill in the art are to understand that they may still make modifications to the technical solutions described in the foregoing embodiments or make equivalent replacements to part or all of technical features thereof. These modifications or replacements do not depart the nature of the corresponding technical solution from the technical solutions of embodiments of this application.

The invention claimed is:

1. A sense amplifier (SA), comprising:
   an amplifying module, configured to amplify voltage difference between a Bit Line (BL) and a Bit Line Benchmark (BLB) when the SA is in an amplifying stage;
   a controllable power module, connected to the amplifying module and configured to stop providing power to the amplifying module when the SA is in a writing stage, to enable the amplifying module to stop working; and
   a writing module, connected to the BL and the BLB, and configured to pull the voltage difference between the BL and the BLB according to data to be written when the SA is in the writing stage;
   wherein the controllable power module is configured to:
   provide power to the amplifying module when the SA is in a recovery stage, to enable the amplifying module to continue to work.

2. The sense amplifier of claim 1, wherein the controllable power module comprises:
   a switch unit, configured with a first end, a second end and a control end, wherein the first end is connected to a power supply end, and the second end is connected to a first end of the amplifying module; and
   a control unit, connected to the control end of the switch unit and configured to generate, when the SA is in the writing stage, a first control signal for controlling the switch unit to be disconnected.

3. The sense amplifier of claim 2, wherein the control unit is configured to:
   generate, when the SA is in the recovery stage, a second control signal for controlling the switch unit to be closed.

4. The sense amplifier of claim 2, wherein the control unit comprises:
   an eleventh transistor having a first end connected to the power supply end, a second end connected to a first end of a cross coupling circuit, and a control end is connected to the control unit.

5. The sense amplifier of claim 4, wherein the eleventh transistor is a P-type transistor.

6. The sense amplifier of claim 5, wherein the control unit comprises:
   a cache circuit having an input end connected to a column selection line and an output end connected to the control end of the eleventh transistor, wherein the cache circuit is configured to perform cache processing on a column selection signal and then output a control signal for controlling the eleventh transistor.

7. The sense amplifier of claim 1, wherein the amplifying module comprises:
   at least one cross coupling amplifying circuit having a first end, a second end, a third end and a fourth end, wherein the first end is connected to an output end of the controllable power module, the second end is grounded, the third end is connected to the BL, and the fourth end is connected to the BLB.

8. The sense amplifier of claim 7, wherein each of the at least one cross coupling amplifying circuit comprises a first transistor, a second transistor, a third transistor and a fourth transistor; and wherein a first end of the first transistor is the first end of the cross coupling amplifying circuit, a second end of the second transistor is the second end of the cross coupling amplifying circuit, a second end of the first transistor is the third end of the cross coupling amplifying circuit, and a second end of the third transistor is the fourth end of the cross coupling amplifying circuit;

the second end of the first transistor is connected to a first end of the second transistor, the second end of the third transistor is connected to a first end of the fourth transistor, the first end of the first transistor is connected to a first end of the third transistor, and the second end of the second transistor is connected to a second end of the fourth transistor; and a control end of the first transistor is connected to the second end of the third transistor, a control end of the second transistor is connected to the second end of the third transistor, a control end of the third transistor is connected to the second end of the first transistor, and a control end of the fourth transistor is connected to the second end of the first transistor.

9. The sense amplifier of claim 7, wherein each of the at least one cross coupling amplifying circuit comprises a fifth transistor, a sixth transistor, a seventh transistor, an eighth transistor, a first switch, a second switch, a third switch and a fourth switch; and wherein a first end of the fifth transistor is the first end of the cross coupling amplifying circuit, a second end of the sixth transistor is the second end of the cross coupling amplifying circuit, a second end of the fifth transistor is the third end of the cross coupling amplifying circuit, a second end of the seventh transistor is the fourth end of the cross coupling amplifying circuit;

the second end of the fifth transistor is connected to a first end of the sixth transistor, the second end of the seventh transistor is connected to a first end of the eighth transistor, the first end of the fifth transistor is connected to a first end of the seventh transistor, and the second end of the sixth transistor is connected to a second end of the eighth transistor;

a control end of the fifth transistor is connected to the second end of the seventh transistor, a control end of the sixth transistor is connected to the second end of the seventh transistor through the first switch, and the control end of the sixth transistor is connected to the first end of the sixth transistor through the third switch; and a control end of the seventh transistor is connected to the second end of the fifth transistor, a control end of the eighth transistor is connected to the second end of the fifth transistor through the second switch, and the control end of the eighth transistor is connected to the first end of the eighth transistor through the fourth switch.

10. The sense amplifier of claim 8, wherein the writing module comprises:

a ninth transistor having a second end for receiving the data to be written, a first end connected to the BL, and a control end connected to a column selection line, wherein the ninth transistor is configured to pull a voltage of the BL according to the data to be written; and a tenth transistor having a second end for receiving the data to be written, a first end connected to the BLB, and a control end connected to the column selection line, wherein the tenth transistor is configured to pull a voltage of the BLB according to the data to be written.

11. The sense amplifier of claim 9, wherein the writing module comprises:

a ninth transistor having a second end for receiving the data to be written, a first end connected to the BL, and a control end connected to a column selection line, wherein the ninth transistor is configured to pull a voltage of the BL according to the data to be written; and a tenth transistor having a second end for receiving the data to be written, a first end connected to the BLB, and a control end connected to the column selection line, wherein the tenth transistor is configured to pull a voltage of the BLB according to the data to be written.

12. The sense amplifier of claim 8, wherein the first transistor and the third transistor are P-type transistors, and the second transistor and the fourth transistor are N-type transistors.

13. The sense amplifier of claim 9, wherein the fifth transistor and the seventh transistor are P-type transistors, and the sixth transistor and the eighth transistor are N-type transistors.

14. A memory, comprising: a sense amplifier (SA) and storage units;

wherein, the SA comprises:

an amplifying module, configured to amplify voltage difference between a Bit Line (BL) and a Bit Line Benchmark (BLB) when the SA is in an amplifying stage;

a controllable power module, connected to the amplifying module and configured to stop providing power to the amplifying module when the SA is in a writing stage, to enable the amplifying module to stop working, wherein the controllable power module is configured to provide power to the amplifying module when the SA is in a recovery stage, to enable the amplifying module to continue to work; and a writing module, connected to the BL and the BLB, and configured to pull the voltage difference between the BL and the BLB according to data to be written when the SA is in the writing stage; and a plurality of the storage units form a first storage array, a second plurality of the storage units form a second storage array, the SA is located between the first storage array and the second storage array, a third end of the SA is connected to a BL of the first storage array, and a fourth end of the SA is connected to a BLB of the second storage array.

15. The memory of claim 14, wherein a first end of the SA is connected to a first power supply end, and a second end of the SA is connected to a second power supply end.

16. The memory of claim 14, wherein each of the storage units comprises a storage capacitor and an access transistor, a first end of the storage capacitor is connected to a charging power, a second end of the storage capacitor is connected to a first end of the access transistor, a second end of the access transistor is connected to the BL, and a control end of the access transistor is connected to a word line.

17. A method for controlling a sense amplifier (SA), the SA comprising an amplifying module, a controllable power module and a writing module, and the method comprising:
- obtaining a working state where the SA is located, wherein the working state comprises a writing stage; and
- generating a first control signal when the working stage is the writing stage;
- wherein the first control signal is used for controlling the controllable power module to stop providing power to the amplifying module, to enable the amplifying module to stop working, and enable the writing module to pull voltage difference between a Bit Line (BL) and a Bit Line Benchmark (BLB) according to data to be written when the SA is in the writing stage;
- wherein the working stage further comprises a recovery stage, and the method further comprises:
  - generating a second control signal when the working stage is the recovery stage;
- wherein the second control signal is used for controlling the controllable power module to provide power to the amplifying module continuously, to enable the amplifying module to continue to work.

* * * * *